US005523259A

United States Patent [19]
Merchant et al.

[11] Patent Number: 5,523,259
[45] Date of Patent: Jun. 4, 1996

[54] METHOD OF FORMING METAL LAYERS FORMED AS A COMPOSITE OF SUB-LAYERS USING TI TEXTURE CONTROL LAYER

[75] Inventors: Sailesh M. Merchant, Orlando, Fla.; Arun K. Nanda, Austin, Tex.; Pradip K. Roy, Orlando, Fla.

[73] Assignee: AT&T Corp., Murray Hill, N.J.

[21] Appl. No.: 349,649

[22] Filed: Dec. 5, 1994

[51] Int. Cl.$^6$ ................................ H01L 21/28
[52] U.S. Cl. .................. 437/190; 437/192; 437/194; 437/246
[58] Field of Search ................ 437/192, 194, 437/195, 197, 245, 190, 246; 257/763, 765

[56] References Cited

U.S. PATENT DOCUMENTS

| | | | |
|---|---|---|---|
| 4,631,804 | 12/1986 | Roy | 29/576 |
| 4,742,020 | 5/1988 | Roy | 437/61 |
| 4,970,176 | 11/1990 | Tracy et al. | 437/187 |
| 5,108,951 | 4/1992 | Chen et al. | 437/187 |
| 5,147,820 | 9/1992 | Chittipeddi et al. | 437/193 |
| 5,298,436 | 3/1994 | Radosevich et al. | 437/29 |
| 5,300,307 | 4/1994 | Frear et al. | 437/198 |
| 5,313,100 | 5/1994 | Ishii et al. | 257/751 |
| 5,332,693 | 7/1994 | Kim | 437/194 |
| 5,356,836 | 10/1994 | Chen et al. | 437/194 |
| 5,371,042 | 12/1994 | Ong | 437/194 |
| 5,374,592 | 12/1994 | MacNaughton et al. | 437/194 |
| 5,407,863 | 4/1995 | Katsura et al. | 437/194 |
| 5,449,641 | 9/1995 | Maeda | 437/195 |

OTHER PUBLICATIONS

Kikkawa et al, "A Quarter Micrometer Interconnection Technology Using a TiN/Al–Si–Cu/TiN/Al–Si–Cu/TiN/Ti Multilayer Structure", IEEE Trans. on Elect. Devices, vol. 40, No. 2, Feb. 1993, pp. 296–302.

Moreau, "Contribution a l'etude des Textures dans les Couches Minces Caracterisation de Barrieres de Diffusion de Nitrure de Titane", Doctoral Thesis, UFR–MIM––Sciences of the University of Metz, 1993, pp. 85; 99–101, 106–107.

Kageyama et al, "Formation of Texture Controlled Aluminum and its Migration Performonce In Al–Si/TiN Stacked Structure", 29th Annual Proceedings, Reliability Physics, IEEE, 1991, pp. 97–101.

Biberger et al, "Comparison of the Film Properties of Sequentially Deposited Non–Collimated Ti/TiN Versus Collimated Ti/TiN", *Defect Structure Morphology And Properties Of Deposits*, Proceedings of a Symposium sponsored by the Non–Ferrous Metals Committee of the Structural Materials Division (SMD) and the Electronic Packaging and Interconnection Materials Committee of the Electronic, Magnetic and Photonic Materials Division (EMPMD) of the Minerals, Metals & Materials Society held during Materials Week '94 in Rosemount, Illinois, Oct. 4–6, 1994, edited by Harish D. Merchant, pp. 379–391.

J. J. Estabil et al., Electromigration Improvements With Titanium Underlay And Overlay In Al(Cu) Metallurgy, VMIC Conference, 1991 IEEE, Jun. 11–12, 1991, pp. 242–248.

C. C. Lee et al., Roles Of Ti–intermetallic Compound Layers On The Electromigration Resistance Of Al–Cu Interconnecting Stripes, J. Appl. Phys. 71 (12), 15 Jun. 1992, pp. 5877–5887.

M. Ben–Tzur et al., Modifications In The Interfacial Reaction Between Thin Films Of Ti and Al Due To Alloying The Al With Si, J. Vac. Sci. Technol. A8 (6), Nov./Dec. 1990, pp. 4069–4071.

*Primary Examiner*—George Fourson
*Assistant Examiner*—Thomas G. Bilodeau
*Attorney, Agent, or Firm*—David M. Sigmond

[57] ABSTRACT

In an integrated circuit, an opening (e.g., via or window) is filled with an Al-based plug which has essentially a <111> orientation and comprises at most three grains. These characteristics are achieved by first depositing a texture control Ti layer having substantially a (002) basal plane orientation followed by at least three Al-based sublayers. The grain sizes and deposition conditions are controlled in such a way that during deposition of the third sublayer, the microstructure of the plug adjusts itself to produce a single grain (or at most three).

24 Claims, 4 Drawing Sheets

5,523,259

METHOD OF FORMING METAL LAYERS FORMED AS A COMPOSITE OF SUB-LAYERS USING TI TEXTURE CONTROL LAYER

BACKGROUND OF THE INVENTION

This invention relates to the deposition of metal layers, such as the conductors in an integrated circuit.

In integrated circuits (ICs), metal layers are used to make electrical contact to device active areas (e.g., as electrodes to the gate, source and drain of FETs) and to interconnect devices to one another (e.g., as runners between devices on the same level of an IC or as vias between devices on different levels). In both cases, vias or windows with essentially vertical sidewalls are opened in an overlying dielectric layer to expose a portion of an underlying layer (e.g., the semiconductor active areas of devices or the commonly referred to "Metal-1" of the first level of metalization). A plug of metal from an overlying metal layer (e.g., "Metal-1" in the case of a device contacts or the commonly referred to "Metal-2" in the case of interconnects) extends through the via or window and makes an electrical connection between a metal layer and a semiconductor (device contact) or between two metal layers (interconnect). For simplicity, we will hereinafter refer to the electrical connection in both cases (metal to semiconductor, and metal to metal) as an interconnect.

Aluminum and aluminum alloys are the most common materials used for such metal layers. Typically, these Al-based layers are deposited as single layers by means of a single-step deposition such as sputtering. Al-based, single-layer metalization, however, suffers several major problems when used to form interconnects in vias or windows: (1) poor step coverage at a top edge of the window, (2) pinch-off or a lack of metal deposition along a sidewall of the window, and (3) overhang or excessive metal above a top edge of the window. Any one or more of these problems may adversely affect IC reliability. Thus, poor step coverage and overhang often produce voids (an absence of metal) in the windows which reduce the ability of the interconnect to carry current. Pinch-off, on the other hand, causes electron crowding, and hence undesirably high current densities, in the sidewall regions where metal is absent.

Lack of adequate step coverage in vertical or near vertical-walled openings or vias, especially those with aspect ratios greater than unity, is often addressed in the prior art by using tapered (i.e., sloped) sidewalls. However, this taper technology results in a larger pitch. Because a larger pitch means increased spacing between parallel metal conductors (e.g., runners), any significant taper is likely to render this technology unsuitable for design rules of, say, 0.5μm, 0.3μm or Other prior art approaches to filling high aspect ratio vias entail multiple step metalization processes. In one case, a thick metal layer is deposited at a cold temperature, and the remainder of the metal is deposited as the temperature is ramped up to allow for reflow of the metal layer. See U.S. Pat. No. 4,970,176 granted to C. J. Tracy et al. on Nov. 13, 1990. In another case, a very thin layer of small grain aluminum is deposited at a cold temperature, typically below 350° C. Deposition is stopped until the temperature is increased to the required deposition temperature, over 500° C., and then deposition of aluminum is resumed. See U.S. Pat. No. 5,108,951 (col. 4, lines 1–9) granted to F. E. Chen et al. on Apr. 28, 1992. The Chen et al. patent goes on to describe an alternative technique in which aluminum is deposited continuously while the wafer is being heated. That is, a small amount of aluminum is deposited at or below 350° C., and as the wafer gradually heats to the desired deposition temperature (400–500° C.), aluminum deposition continues. Chen et al. reports that this technique gives a layer of aluminum which is deposited with very small grain sizes, tending to minimize grain size growth at later stages (col. 4, lines 10–21).

None of these multi-step metalization processes for filling high aspect ratio vias, however, recognizes the important relationship between interconnect performance and the need for a plug which has both a large grain size and a particular texture (i.e., grain orientation).

Thus, a need remains in the art for a metalization scheme that addresses the above problems in fabricating interconnects in essentially vertical-walled vias or windows. A particular need remains for such a metalization scheme which is suitable for high aspect ratio vias such as those present at sub-half-micron design rules.

SUMMARY OF THE INVENTION

These problems are addressed in accordance with one aspect of the invention, a method of making integrated circuits in which an opening (e.g., via or window) is filled with an Al-based plug by depositing a texture control Ti layer under conditions which yield a predetermined orientation in subsequently deposited Al-based layers. Then a plurality of Al-based sublayers are deposited: first, a fine grained first sublayer with essentially a <111> orientation is deposited at a relatively cold temperature on the Ti layer; next, a second sublayer is deposited on the first sublayer while the temperature is ramped up from the cold temperature to a peak deposition temperature, so that, during the ramp up, a Ti-aluminide layer is formed at the interface between the Ti layer and the first sublayer, and so that the grain size of the Al-based material increases; and next, a third sublayer is deposited at the peak temperature. During deposition of the third sublayer, the entire microstructure of the plug adjusts itself so that the plug comprises a single grain or at most three grains, and, in addition, the texture of the entire plug has essentially a <111> orientation.

Another aspect of the invention is an integrated circuit including a Ti-aluminide layer and an Al-based plug which fills an opening (e.g., a via or window). The texture of the Al-based plug has essentially a <111> orientation, and the plug itself comprises a single grain, or at most three grains.

BRIEF DESCRIPTION OF THE DRAWINGS

The invention, together with its various features and advantages, can be readily understood from the following more detailed description taken in conjunction with accompanying drawing, in which.

In the interests of clarity of illustration, the figures have not been drawn to scale.

DETAILED DESCRIPTION

An integrated circuit (IC) typically comprises a semiconductor body (e.g., a silicon substrate or a silicon epitaxial layer on a substrate) in which the active regions of devices (e.g., FETs, bipolar transistors) or the passive regions of other devices (e.g., resistors, capacitors) are formed. Devices on different parts of a wafer are typically insulated from one another by insulative (e.g., oxide) regions, and selected devices are interconnected by means of conductive (e.g., metal) layers. Due to the complexity of the interconnection patterns, the metal layers are formed on more than one level (commonly two levels, but increasingly three or four levels).

Figure 1:
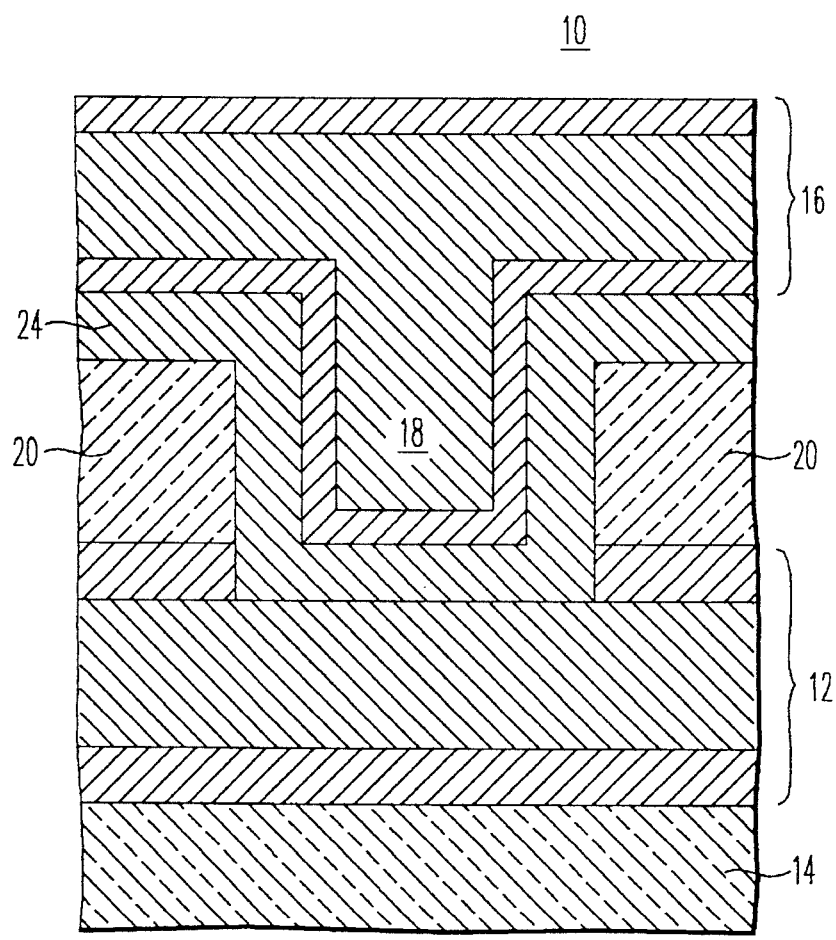
FIG. 1 is a schematic rendering of the cross-section of a plug in a via which interconnects Metal-1 and Metal-2 layers in an IC.

Different levels of metal layers, as well as metal layers and semiconductor device areas, are electrically insulated from one another by one or more insulative (e.g., silicon oxide or silicon nitride) layers, except in those areas where electrical connections are desired. These insulative layers are sometimes referred to as interlayer dielectrics. In those areas, vias or windows are opened in the insulative layer(s) and then filled with metal plugs. FIG. 1 schematically illustrates a portion of an IC 10 which includes a composite Metal-1 layer 12 on Si body 14. For example, body 14 may comprise a wafer or substrate with or without a Si epitaxial layer and typically with silicon oxide isolation regions separating devices and/or device regions as described above, but not shown. Thus, although the following description relates to interconnects between Metal-1 and Metal-2, the invention is also applicable to connections between Metal-1 and semiconductor device regions, or between Metal-2 and higher level metals.

Continuing with the description of the Metal-1 to Metal-2 interconnect, FIG. 1 shows that Metal-1 layer 12 is interconnected with composite Metal-2 layer 16 by means of metal plug 18. The Metal-1 and Metal-2 layers are separated from one another by insulative layer 20 in which an opening (e.g., a via or window) is formed to allow plug 18 to extend from Metal-2 to Metal-1. In accordance with one aspect of the invention, both the plug 18 and the Metal-2 layer 16 are formed by depositing a texture control Ti layer 24 under conditions which yield a predetermined orientation in subsequently deposited Al-based layers. More specifically, the texture control Ti layer 24 should be deposited under conditions which produce a close-packed Ti layer having essentially a basal plane (002) orientation. This basal plane of Ti has the same atomic configuration as the (111) plane of Al-based layers, which thereby induces M-based layers to have essentially a <111> orientation when deposited on such a Ti layer.

After the Ti texture control layer 24 is deposited, a plurality of Al-based sublayers are sequentially deposited, each under different deposition conditions which result in grain boundary diffusion, recrystallization and grain growth. For example, the sublayers may be deposited at different deposition rates and under conditions which produce a plug 18 having essentially a <111> orientation and having a single grain or at most three grains. Although the ability to form a plug with as little as a single grain is determined by the inventive fabrication process, the maximum size of the grain(s) is determined by the dimensions of the plug (or of the via in which it is formed). In general, fewer grains means fewer grain boundaries which, in turn, means fewer defects and, hence, better electromigration characteristics and less stress-induced voiding. Thus, a single grain is optimum in this regard, but two or three grains still provide excellent performance.

FIGS. 2–7 illustrate the sequential steps in the fabrication of such an interconnect. In this example, the plug 18 and the laterally extending field portions are deposited initially as three sublayers. However, the invention is not limited in scope to three sublayers; more than three (e.g., four sublayers or more) are also suitable.

In the following illustrative description, it will be assumed that all metal layers are deposited by sputtering, although the invention is not limited to this technique (e.g., evaporation may also be suitable). In addition, the process is conveniently carried out in a state-of-the art cluster tool or machine with individual deposition chambers. To improve deposition uniformity across a wafer, sputtering is preferably performed using planar targets.

Figure 2:
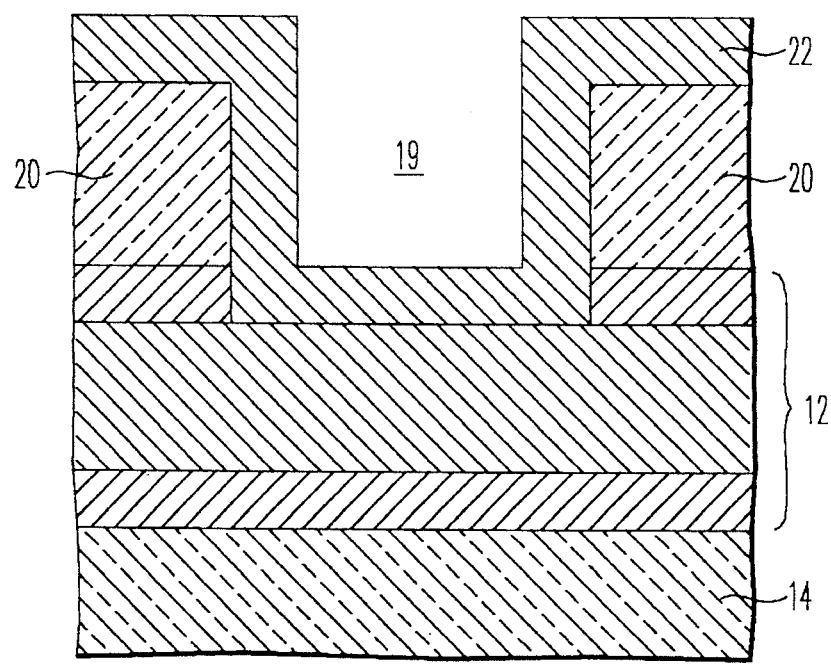
FIGS. 2–6 show schematically the sequential steps in the fabrication of the plug of FIG. 1 in accordance with one embodiment of the invention.
Figure 3:
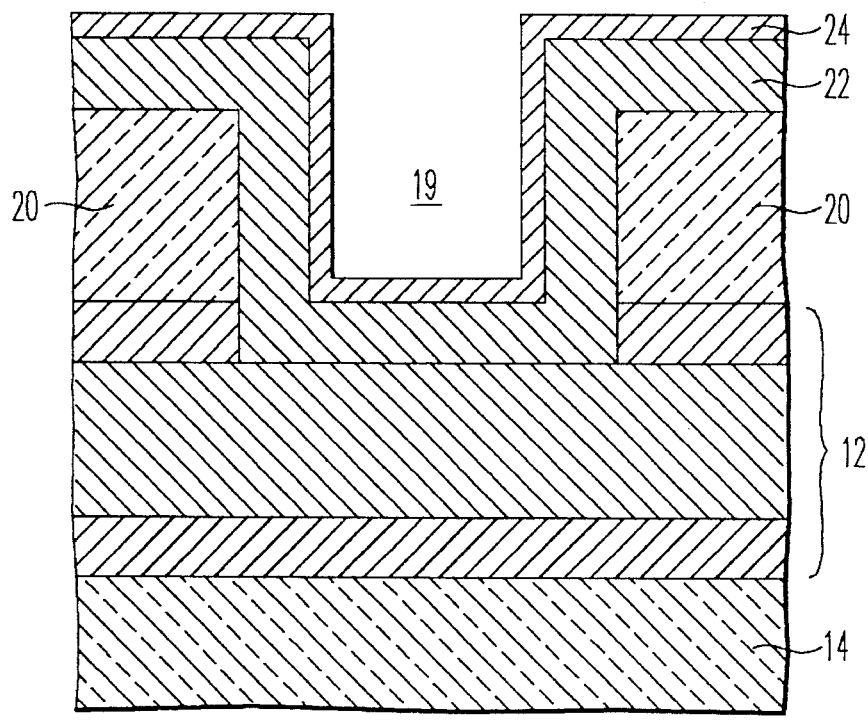

In a first step, shown in FIG. 2, a well-known composite barrier layer 22 is deposited on the bottom and sidewalls of via 19 and on the top of oxide layer 20. The barrier layer illustratively comprises two layers (not shown): a refractory metal (e.g., Ti) formed on the surface of the via and a refractory metal nitride (e.g., TiN) formed on the refractory metal. Deposition of barrier layer 22 typically takes place at a substrate or wafer temperature in the range of about 25°–400° C. Next, as shown in FIG. 3, a thin ($\leq 250$ Å) texture control Ti layer 24 is deposited on barrier layer 22, under conditions which produce a close-packed structure with essentially a basal plane (002) orientation. Thus, layer 24 is deposited at a substrate or wafer temperature in the range of about 25°–400° C.; preferably at a cold temperature of $\leq 100°$ C. (50° C. has been found to be suitable). During subsequent deposition of Al-based metals in via 19, a layer of Ti-aluminide is formed at the interface between layer 24 and the first deposited M-based layer. The texture of the Al-based metals has essentially a <111> orientation, and the plug 18 ultimately formed comprises a single grain (or at most three). Layer 24 also improves mechanical and electrical reliability.

Figure 4:
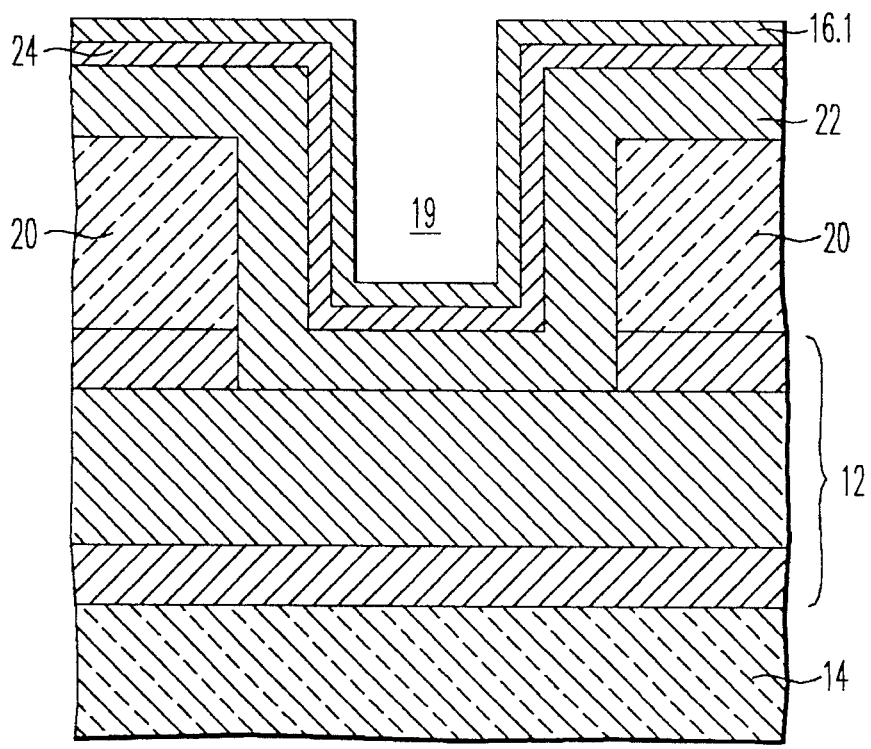
Figure 5:
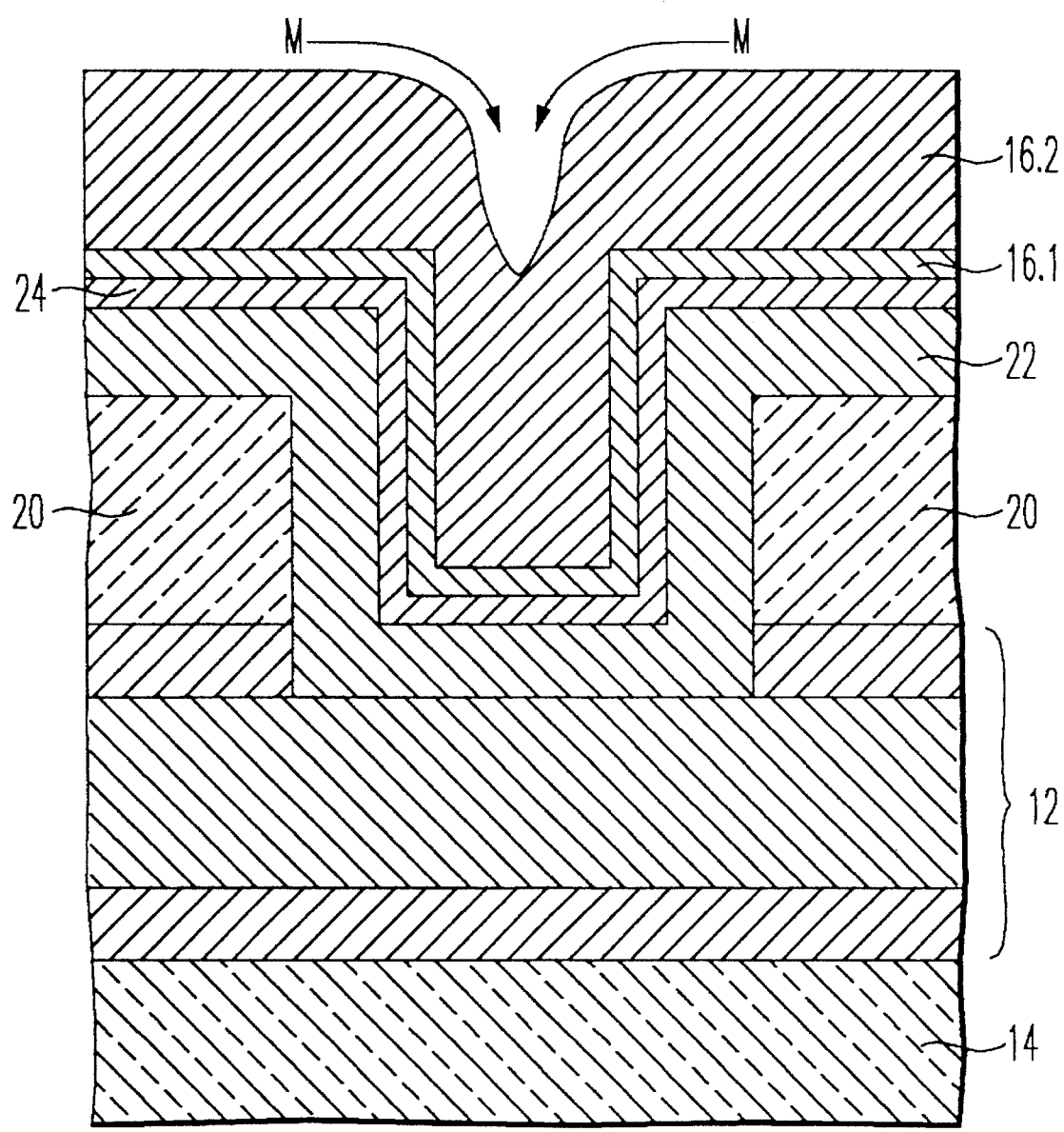
Figure 6:
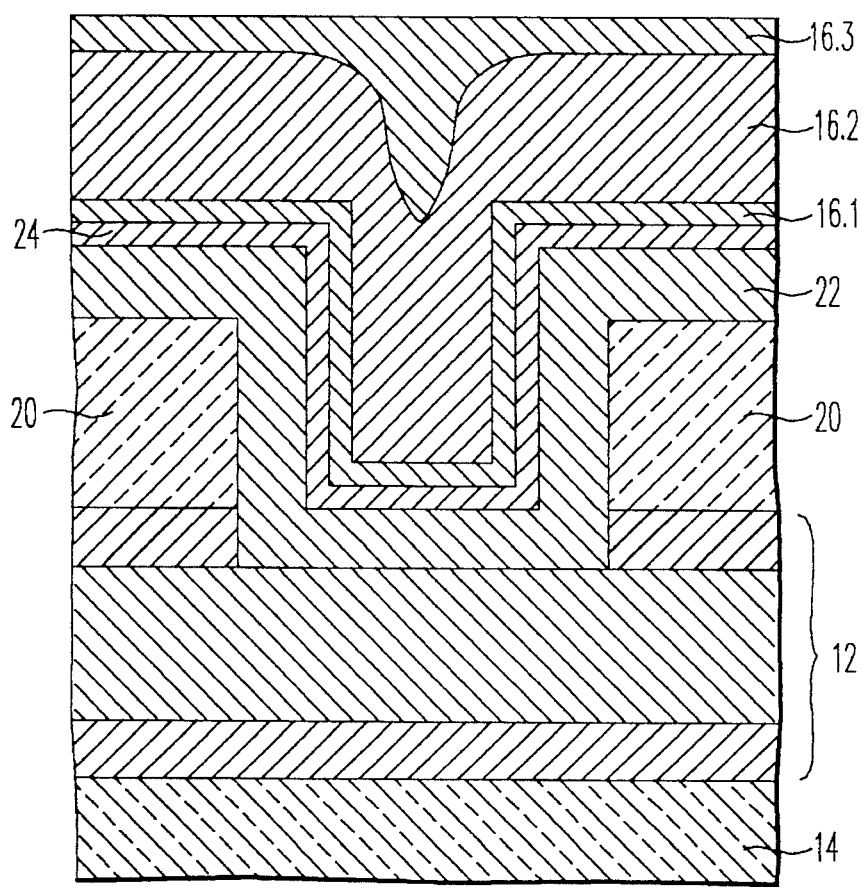

After deposition of layer 24, three Al-based metal sublayers 16.1, 16.2 and 16.3 are sequentially deposited as shown in FIGS. 4–6. However, if after deposition of layer 24 is complete, the substrate or wafer temperature is above about 100° C., then the substrate or wafer should be cooled before the deposition of the first sublayer 16.1.

The sublayers comprise M-based metals such as M-based alloys. Suitable alloys include Al—Cu, Al—Si—Cu, Al—Sc, Al—Ge, Al—Sc—X, Al—Ge—X (where X=Si and/or Cu), Al—Pd—Nb, Al—Pd—Mg, Al—Hf—Ti, etc. The composition of the AlCu or AlSiCu alloys may comprise about 0.05–5.0% Cu by weight and 0.05–5.0% Si by weight, and typically 0.5–2.0% Cu and 0.5–1.5% Si by weight.

The first sublayer 16.1, shown in FIG. 4, is relatively thin and serves as a nucleation layer for deposition of the second sublayer. Sublayer 16.1 has a relatively small average grain size (e.g., $\leq 2500$ Å, typically 1000–1700 Å) which is achieved by deposition at a cold substrate or wafer temperature of about 50°–100° C. Illustratively, deposition also takes place at a relatively high deposition rate and at high power (e.g., 9–11 kW and about 160 to 190 Å/sec.). The typical thickness of sublayer 16.1 is about 30–50% of the total thickness of the three sublayers.

At the end of its deposition, the second sublayer 16.2, shown in FIG. 5, has a much larger average grain size than sublayer 16.1; typically about 2–3 times larger, or illustratively about 2500–8000 Å, depending on the dimensions of the plug. Sublayer 16.2 is deposited while the substrate or wafer temperature is ramped up from the deposition temperature of sublayer 16.1 to a peak temperature in the range of about 400°–500° C. (typically 460°–500° C.). Illustratively, sublayer 16.2 is deposited at a much lower deposition rate (e.g., about 10 to 30 Å/sec.) and at a much lower power (e.g., 0.5–1.5 kW) than sublayer 16.1. During the deposition of sublayer 16.2, the previously-mentioned Ti-aluminide compound forms, typically at a temperature of about 300°–350° C., at the interface between sublayer 16.1 and Ti layer 24. Depending on the relative thicknesses of the Ti layer 24 and the sublayer 16.1, the former may or may not be totally converted to Ti-aluminide. If not, a portion of Ti layer 24 remains in the plug when the IC is completed. In addition, during this step the deposited metal (M) flows into the vias (FIG. 5) typically to a thickness which is about 50–70% of the total thickness of the three sublayers (or of the Metal-2 layer 16).

At the end of its deposition, the third sublayer 16.3, shown in FIG. 6, has a relatively large average grain size (e.g., 2500–10,000 Å), depending on the dimensions of the plug. This characteristic is achieved by deposition at the peak temperature of the ramp up used in the previous step (e.g., at 460°–500° C.). Illustratively, sublayer 16.3 is also deposited at the relatively high deposition rates used for first sublayer 16.1. Importantly, during this step, the microstructure of the plug 18 adjusts itself so that the plug comprises only a single large size grain or at most three large sized grains. Moreover, the texture of the plug has essentially a <111> orientation.

As mentioned previously, the maximum grain size is determined by the dimensions of the plug. For example, a plug which is 8000 Å high and 8000 Å wide may contain a single grain of 8000 Å size or two grains each of 8000×4000 Å size.

Figure 7:
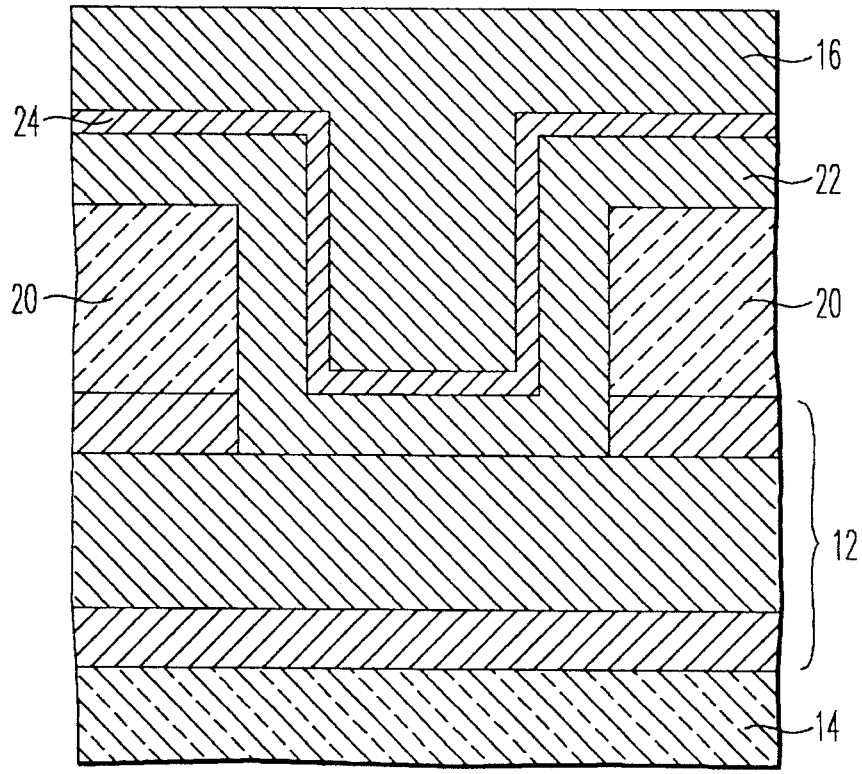
FIG. 7 depicts FIG. 6 with various sublayers shown as a single layer.

The ability of the invention to realize a plug which comprises a single <111> oriented grain (or at the most three) enables the via to be filled, as shown in FIG. 7, without the attendant prior art problems of pinch off, overhang, voids, etc., as well as with improved electromigration properties and reduced stress-induced voiding. Because of the presence of a single grain (or at most three) in the plug area, FIG. 7 does not depict the various sublayers of Metal-2 layer 16.

In addition, our TEM investigations have also uncovered the presence of small material islands (of the order of 10 Å in size) at the interface between sublayers 16.1 and 16.2, before the deposition of sublayer 16.3. The likely composition of the islands comprises a silicon oxide, an aluminum oxide or a solute-bearing precipitate of aluminum (e.g., $CuAl_2$). We have found that these islands may desirably inhibit interface diffusion, initially pin the grain boundaries of the Al-based layers (which allows for a <111> texture), and/or prevent void linkage due to stress-induced voiding. Thus, device lifetimes are increased.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although the principles of the invention are described in terms of forming interconnects and filling openings, they are equally applicable to covering steps and forming metal layers in general.

In addition, the sublayer deposition steps may be undertaken in the same deposition chamber by keeping the wafer or substrate heater off during the deposition of the first sublayer, turning it on at the beginning of the deposition of the second sublayer and leaving it on until all sublayer depositions are complete. Forming the plug in this manner allows multiple chamber processing in the cluster machine or tool because two or more chambers can be used for parallel processing of the sublayer deposition, thereby increasing throughput. Furthermore, the second sublayer may be deposited at an initial temperature which is less than, equal to, or greater than the deposition temperature of the first sub layer.

We claim:

1. A method of fabricating an integrated circuit which includes a composite metal layer, characterized in that said metal layer is formed by the steps of:

depositing a texture control Ti layer at a first temperature so that said Ti layer has essentially a (200) basal plane orientation and subsequently deposited Al-based layers have essentially a <111> orientation, depositing an Al-based first sublayer at a second temperature on said Ti layer, while increasing the temperature from a third temperature to a peak temperature greater than said second temperature, depositing an Al-based second sublayer on said first sublayer so that a Ti-aluminide layer forms at least at the interface between said Ti layer and said first sublayer, and so that, at the end of its deposition, the grain size of said second sublayer is greater than that of said first sublayer, and at said peak temperature depositing an Al-based third sublayer on said second sublayer so that the microstructure of said sublayers adjusts itself to produce at most three grains.

2. The method of claim 1 wherein said Ti layer is deposited so as to have a close-packed structure.

3. The method of claim 2 wherein said first temperature during deposition of said Ti layer is in the range of approximately 50°–100° C.

4. The method of claim 1 wherein said second temperature during deposition of said first sublayer is in the range of approximately 50°–100° C.

5. The method of claim 1 wherein said second sublayer is deposited while increasing the temperature from below about 100° C. to about 400°–500° C.

6. The method of claim 1 wherein said first sublayer is deposited so as to have an average grain size of less than about 2500 Å.

7. The method of claim 1 wherein said second sublayer is deposited so that, at the end of its deposition, said Al-based layers have an average grain size of about 2500–8000 Å.

8. The method of claim 1 wherein said third sublayer is deposited at a temperature of about 460°–500° C. and so that said microstructure adjusts itself to have at most three grains of size in the range of about 2500–10,000 Å.

9. The method of claim 8 including forming a plug portion in a via and wherein said size of said at most three grains is determined by the dimensions of said via.

10. The method as in any one of claims 1 to 9 further characterized in that said sublayers are deposited by sputtering.

11. The method as in any one of claims 1 to 9 wherein material islands are formed at the interface between said first and second sublayers.

12. The method of claim 11 wherein said islands comprise an oxide of aluminum or silicon or a solute-bearing precipitate of aluminum.

13. The method of claim 1 wherein said aluminide layer is formed under conditions which consume the entirety of said texture control Ti layer.

14. The method of claim 1 wherein said aluminide layer is formed under conditions which consume only a portion of said texture control Ti layer.

15. A method of fabricating an integrated circuit comprising the steps of providing a silicon body which includes active device regions, forming an Al-alloy first layer at a first level in said circuit and in contact with at least one of said device regions, forming an Al-alloy second layer at a second level in said circuit, forming insulative layers separating said first and second layers from one another and separating said first layer from said device regions, forming an interconnect comprising a plug portion connecting at least one of said first and second layers or connecting said first layer and a device region, or both, characterized in that said plug portion is formed by the steps of:

sputtering a first Ti layer and a TiN layer thereon, sputtering a texture control Ti layer on said TiN layer so that said control layer has a close-packed structure and essentially a (002) basal plane orientation and so that subsequently deposited Al-alloy sublayers have essentially a <111> orientation, sputtering an Al-alloy first sublayer on said control layer at a first temperature in the range of about 50°–100° C. so that said first sublayer has an average grain size of ≦2500 Å, sputtering an Al-alloy second sublayer on said first sublayer while the temperature is being increased from said first temperature to about 400°–500° C. so that a Ti-aluminide layer forms at least at the interface between said second Ti layer and said first Al-alloy sublayer and so that, at the end of the deposition of said second sublayer, said Al-alloy layers have an average grain size of about 2500–8000 Å; and sputtering an Al-alloy third sublayer on said second sublayer at a temperature of about 460°–500° C. so that the microstructure of said sublayers adjust themselves to at most three grains of size in the range of about 2500–10,000 Å.

16. The method of claim 1 wherein said third temperature is less than said second temperature.

17. The method of claim 1 wherein said third temperature is equal to said second temperature.

18. The method of claim 1 wherein said third temperature is greater than said second temperature.

19. The method of claim 1 wherein said microstructure adjusts itself to produce three grains.

20. The method of claim wherein said microstructure adjusts itself to produce two grains.

21. The method of claim 1 wherein said microstructure adjusts itself to produce one grain.

22. The method of claim 1 wherein said Ti layer is deposited on a TiN layer disposed on a second Ti layer.

23. The method of claim 22 wherein said second layer Ti layer is deposited on a substrate at a fourth temperature which is greater than the first temperature.

24. The method of claim 23 wherein said first temperature is in the range of about 25°–100° C.

* * * * *

UNITED STATES PATENT AND TRADEMARK OFFICE
CERTIFICATE OF CORRECTION

| | | |
|---|---|---|
| PATENT NO. | : 5,523,259 | Page 1 of 1 |
| APPLICATION NO. | : 08/349649 | |
| DATED | : June 4, 1996 | |
| INVENTOR(S) | : Merchant et al. | |

It is certified that error appears in the above-identified patent and that said Letters Patent is hereby corrected as shown below:

Col. 6, line 16

In claim 1, line 1, replace "200" with "002".

Signed and Sealed this

Seventh Day of September, 2010

David J. Kappos
*Director of the United States Patent and Trademark Office*